(12) United States Patent
Pereira et al.

(10) Patent No.: US 9,991,133 B2
(45) Date of Patent: Jun. 5, 2018

(54) METHOD FOR ETCH-BASED PLANARIZATION OF A SUBSTRATE

(71) Applicant: Tokyo Electron Limited, Minato-ku, Tokyo (JP)

(72) Inventors: Cheryl Pereira, Loudonville, NY (US); Nihar Mohanty, Clifton Park, NY (US); Lior Huli, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/675,372

(22) Filed: Aug. 11, 2017

(65) Prior Publication Data
US 2018/0047584 A1    Feb. 15, 2018

Related U.S. Application Data

(60) Provisional application No. 62/373,448, filed on Aug. 11, 2016.

(51) Int. Cl.
*B44C 1/22*        (2006.01)
*C03C 15/00*     (2006.01)
*C03C 25/68*     (2006.01)
*C23F 1/00*        (2006.01)
*H01L 21/321*   (2006.01)

(52) U.S. Cl.
CPC .. *H01L 21/3212* (2013.01); *H01L 2221/1005* (2013.01)

(58) Field of Classification Search
USPC ........................................................ 216/89
See application file for complete search history.

(56) References Cited

U.S. PATENT DOCUMENTS

2011/0039413 A1* 2/2011 Akinmade-Yusuff  H01L 21/0335
                                                                            438/700

* cited by examiner

*Primary Examiner* — Roberts Culbert

(57) ABSTRACT

Techniques herein provide an etch-based planarization technique. An initial film is deposited on a substrate. Deposition of this initial film results in a non-planar film because of differences in area density of underlying structures (for example, open areas compared to closely spaced trenches). Etch processes are executed that use a reverse lag RIE process to planarize the initial film, and then another coat of the film material can be deposited, resulting in a planar surface. Such techniques can planarized substrates without using chemical mechanical polishing (CMP).

20 Claims, 3 Drawing Sheets

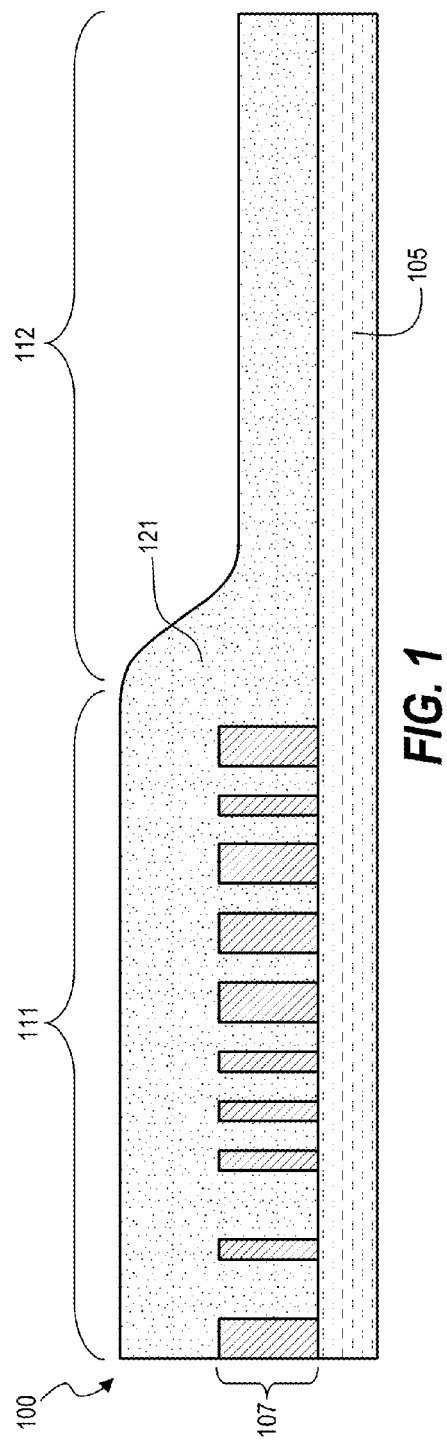
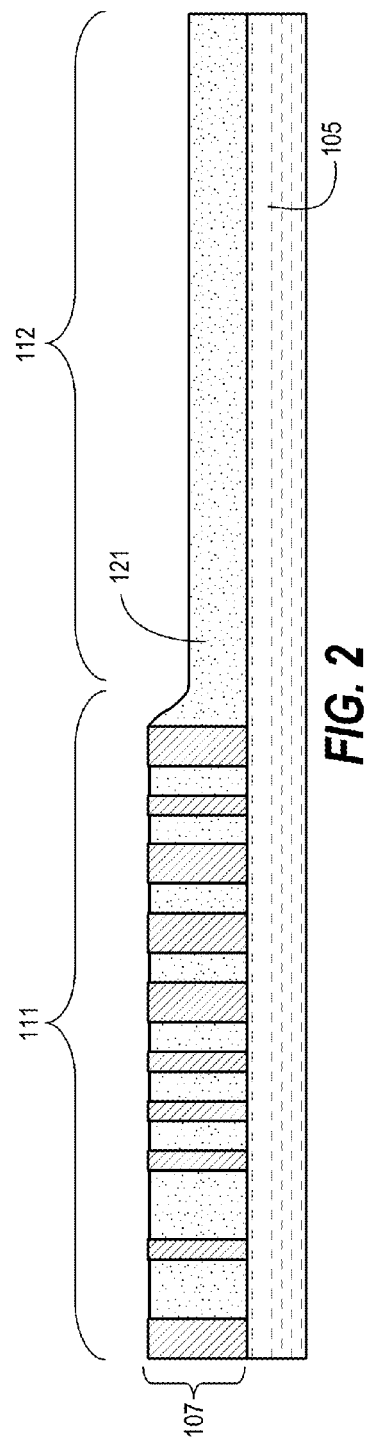

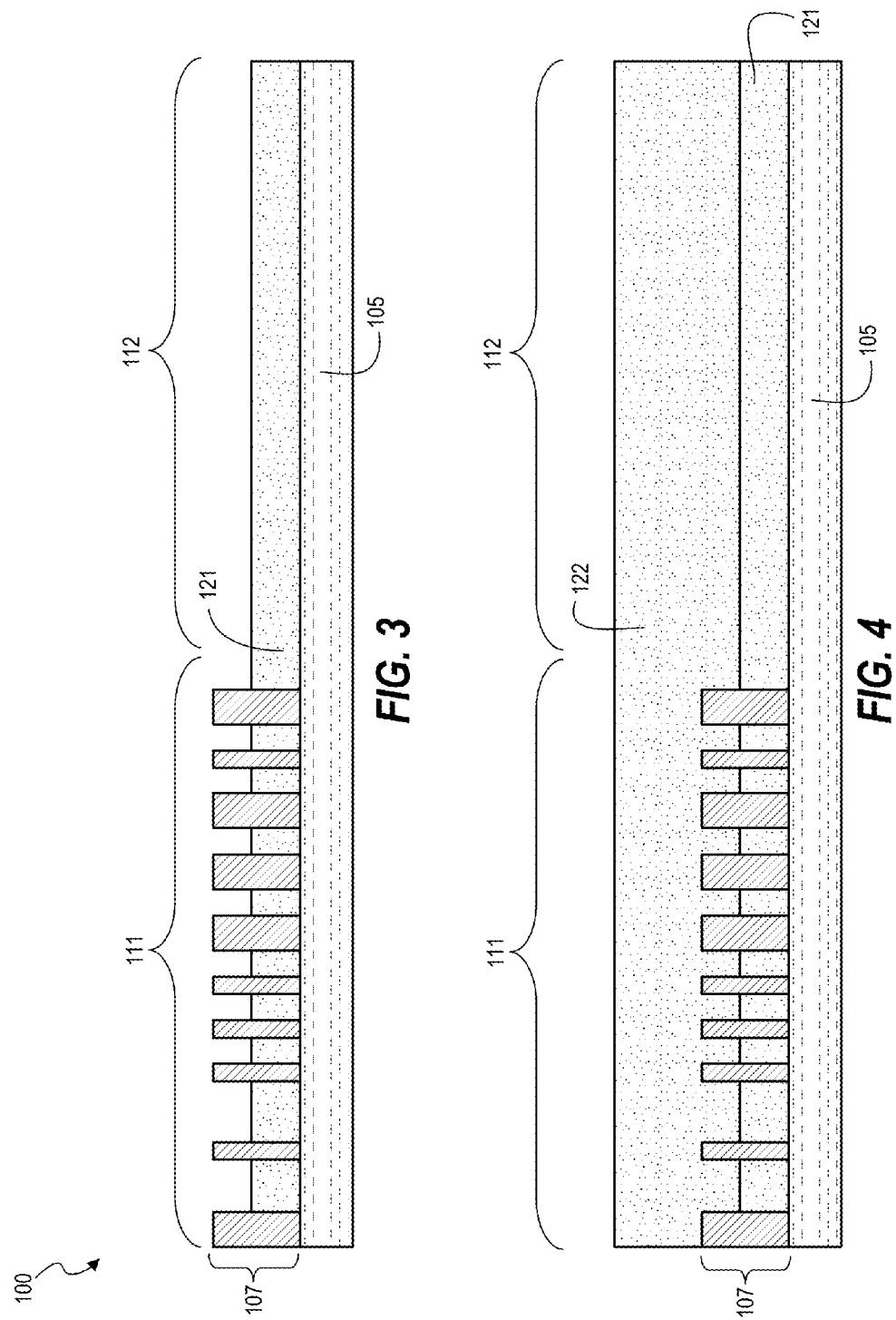

METHOD FOR ETCH-BASED PLANARIZATION OF A SUBSTRATE

CROSS REFERENCE TO RELATED APPLICATIONS

The present application claims the benefit of U.S. Provisional Patent Application No. 62/373,448, filed on Aug. 11, 2016, entitled "METHOD FOR ETCH-BASED PLANARIZATION OF A SUBSTRATE," which is incorporated herein by reference in its entirety.

BACKGROUND OF THE INVENTION

This disclosure relates to microfabrication including microfabrication of integrated circuits.

Semiconductor manufacturing includes various patterning processes including deposition, photolithography, etching, planarization, doping, etc. These patterning processes are repeated as structures are created, modified and removed. Photolithographic and other patterning processes typically benefit from a planar surface for depositing the various films and resists used to pattern and form structures on a wafer. Films can be specified to have a particular height and/or be planarized to within certain dimensions, depending on a given fabrication process.

Planarization is commonly performed using a process known as Chemical Mechanical Polishing (CMP). CMP is a process that uses corrosive chemicals and a polishing pad to planarize the surface of a wafer, similar to how wet sanding works. CMP can planarize insulators and conductors in multilevel structures. This planarization can be used to stack more electronics onto another layer of a wafer, or to planarize the wafer for subsequent photo lithographic patterning.

SUMMARY

Although chemical mechanical planarization can provide a planar surface on a wafer, there are limitations and drawbacks to using CMP. CMP is typically executed by applying spin-on glass (SOG) on a wafer and then using corrosive chemicals and physical abrasion. Thus, CMP is a very harsh and physically abrasive process compared to other microfabrication techniques. CMP, therefore, cannot be used for many process steps of microfabricating an integrated circuit. For example, CMP cannot be used for microfabricating transistors and other front-end-of-line structures—especially when a gate oxide is exposed. Moreover, CMP processes are very expensive to run, challenging to perform, and typically reduce yield of functional integrated circuits.

Techniques disclosed herein provide a dry etch-based planarization process, such as with plasma-based etching, to provide a planar surface on a substrate for continued microfabrication. Techniques include modifying a substrate coating using a reverse RIE (reactive ion etch) lag process to normalize coating height even when there are underlying features of differing densities, opening widths, and structure heights.

One embodiment includes a method of planarizing a substrate. A substrate is received that has micro-fabricated structures formed thereon. The micro-fabricated structures are positioned on a working surface of the substrate. The micro-fabricated structures define openings between each other. The openings have different widths including first openings and second openings. The first openings have a lesser width as compared to the second openings. The second openings have a greater width as compared to the first openings. A first layer of fill material is deposited on the substrate. The first layer covers the micro-fabricated structures and fills the first openings and fills the second openings. The first layer results in a top surface that is non-planar in that top surface locations of the first layer differ in z-height compared to each other by 1-100 nanometers. The first layer has z-heights above the first openings that are greater as compared to z-heights above the second openings.

A first etch process is executed that etches the first layer until uncovering top surfaces of the micro-fabricated structures. The second etch process is executed that etches the first layer such that the fill material within the first openings is etched at a faster rate as compared to etching of fill material within the second openings. The second etch process is executed until the top surface of the first layer is planar. A second layer of fill material is deposited on the substrate, resulting in a planar layer or overcoat.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIG. 1 is a cross-sectional schematic view of an example substrate segment showing a process flow according to embodiments disclosed herein.

FIG. 2 is a cross-sectional schematic view of an example substrate segment showing a process flow according to embodiments disclosed herein.

FIG. 3 is a cross-sectional schematic view of an example substrate segment showing a process flow according to embodiments disclosed herein.

FIG. 4 is a cross-sectional schematic view of an example substrate segment showing a process flow according to embodiments disclosed herein.

DETAILED DESCRIPTION

Figure 5A:
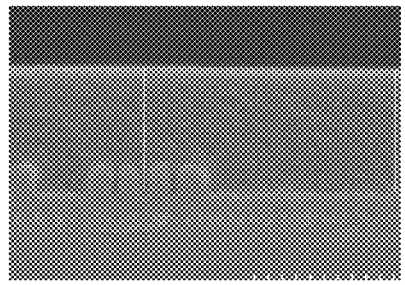
FIGS. 5A-5B include magnified views of example substrate segments demonstrating process flow according to embodiments disclosed herein.

Techniques herein provide an etch-based planarization technique. An initial film is deposited on a substrate. Deposition of this initial film results in a non-planar film because of differences in area density of underlying structures (for example, open areas compared to closely spaced trenches). Etch processes are executed that use a reverse lag RIE process to planarize the initial film, and then another coat of the film material can be deposited, resulting in a planar surface.

Planarization is an important step in many microfabrication processes. Accurate, economical, and non-damaging planarization is becoming more desired as semiconductor node scaling continues. By way of a non-limiting example, planarization techniques herein can assist with micro-fabrication of advanced node narrow pitch back-end-of-line (BEOL) trench patterning, as well as front-end-of-line (FEOL) device patterning.

To maintain pitch scaling, BEOL trench patterning at N7 and beyond demands sub-36 nm pitch features. Patterning this small of a pitch can be challenging, but can be achieved by a variety of methods including self-aligned double patterning (SADP), 193 nm self-aligned quadruple patterning (SAQP), and directed self-assembly (DSA). Such pattering can occasionally be achieved by extreme ultraviolet lithography (EUV) with 13.5 nm radiation. A useful step in the trench patterning process is an area selective blocking process where the "infinite" lines are cut into chains or line ends, cuts, et cetera, to form a final desired trench layout. As pitches get smaller, overlay requirements of such a block pattern go beyond the capability of the lithographic tools, which can stymie the pitch scaling in the BEOL.

One technique to enable sub-lithographic blocking is a self-aligned block (SAB) technique that uses multiple lines of different etch resistivities to selectively etch only certain structures in an uncovered area (through etch mask openings). Various different materials can be used to provide different etch resistivities or "colors." One useful material in such patterning processes is spin-on metal hard masks (MHM) to help enable such combination mask and etch selective blocking. Example materials for such hard masks include TiOx, ZrOx, SnOx, HFOx, TaOx, and so forth.

One challenge with spin-on films, including metal oxides, is planarization across isolated and dense areas (in terms of area density of protruding structures). This iso-dense area differences on substrates are similar to how rural areas have buildings that are few and far between as compared to buildings in urban areas that are spaced closer together. In various integrated circuits there can be areas with relatively few structures such as unpatterned areas and power rail areas or areas otherwise having comparatively wide trenches. These are the "iso" areas. FIG. 1 illustrates this difference. Substrate segment 100 includes micro-fabricated structures 107 positioned on underlying layer 105. Region 112 of substrate segment 100 has no or few micro-fabricated structures 107. This is an iso area as there is a relatively large distance between structures. As such, the underlying layer 105 is mostly uncovered. Region 111 of substrate segment 100 has comparatively many micro-fabricated structures 107. The gaps between these structures 107 are relatively small in dimension. On a substrate that is already planar or flat, spinning on an additional material can result in an essentially planar film. When spin depositing on a substrate having protruding structures of different areal densities, however, a non-planar spin coating results. The resultant film typically has greater z-heights over areas having many structures per unit area, or areas of smaller openings/distances between structures.

Various films and substrate coatings are conventionally deposited by spin-on deposition. When a given topology or relief pattern has regions of densely arranged structures, this density can push deposition material upward and manipulate a mass fraction of how much material can go into spaces. In regions of sparsely arranged or populated features (for example, where there is a single line without other features nearby), the filler material can settle down into these larger pockets such that a deposited z-height at these locations can be approximately a height of isolated features. A z-height herein is a distance measured perpendicular from a top surface of the underlying layer to a top surface of the fill material (for example, a spin-on coating). Most substrates being manufactured have some type of variable topography. Thus, in a typical substrate, there will be areas with a relatively dense arrangement of structures, and areas with few structures and lines (or comparatively fewer). When a film is deposited to cover and/or fill-in such a topology, the result is typically a film with an uneven or nonplanar surface. Note that for convenience in describing embodiments, examples herein focus on spin-on materials. Techniques herein, however, are useful for all gap-fill materials including spin-on, flowable, chemical vapor deposition (CVD), atomic layer deposition (ALD), and so forth.

Techniques herein include methods to achieve a zero height delta between these two areas (iso and dense) by modifying plasma processes to create a reverse RIE lag effect during etch back. Aspect ratio and pattern density generally affect etch rate for features less than 1 micron. Typically when etching a wafer, RIE lag is observed. RIE lag happens when the (comparatively) open areas etch faster than the patterned areas. This is caused by depletion of ions in small feature areas. Ions entering a narrow trench are captured by the sidewalls of the trench causing ion depletion and ions are also deflected by electrostatic fields causing ion deflection. Conventional etch processes aim to achieve uniform etching across a substrate and so this lag is not typically desirable. By changing the pressure and chemistry during the etch process herein, however, the etch rate is changed creating a reverse RIE lag, which can be used herein to make a film with a zero height delta.

One embodiment includes receiving a substrate having micro-fabricated structures formed thereon. The micro-fabricated structures are positioned on a working surface or upper portion of the substrate. For example, features (such as lines, mesas, fins, et cetera) are formed on a working surface of the substrate such that features define a substrate topography. The micro-fabricated structures define openings between each other. The openings have different widths including first openings and second openings. The first openings having a lesser width as compared to the second openings. The second openings having a greater width as compared to the first openings. In other words, a given substrate can have some areas or regions of relatively narrow trenches, while other areas of the substrate have relatively wide trenches or openings. Thus, the two or more regions have a different density of micro-fabricated structures per unit area as compared to each other. FIG. 1 illustrates an example. Region 111 has structures with openings or distances between each other that are smaller as compared to distances between structures in region 112.

A first layer 121 of fill material is deposited on the substrate. The first layer covers the micro-fabricated structures 107 and fills the first openings and fills the second openings. Such a fill material can be selected from various metal oxides, silicon-containing films, carbon films, et cetera. Deposition of the first layer 121 results in a top surface that is non-planar in that top surface locations of the first layer differ in z-height compared to each other by 1-100 nanometers. Note that as illustrated, the first layer 121 has z-heights above the first openings that are greater as compared to z-heights above the second openings. In other words, the fill material is higher in regions of greater density of micro-fabricated structures as compared to regions of lesser density of micro-fabricated structures.

The first openings—distances between adjacent structures—are smaller as compared to second openings. Thus, the first layer has greater z-heights in regions of greater density of micro-fabricated structures as compared to regions of lesser density of micro-fabricated structures.

A first etch process is executed that etches the first layer 121 until uncovering top surfaces of the micro-fabricated structures 107. Uncovering top surfaces of micro-fabricated structures 107 can include top surfaces of tallest structures wherein there are structures of different heights, or this can include uncovering all top surfaces even when there are structures of different heights. FIG. 2 illustrates an example result of this first etch process. Note that although the film has been etched down to tops of lines in the dense area (region 111), the first layer 121 has a lower top surface in the isolated area (region 112).

A second etch process is executed that etches the first layer 121 such that the fill material within the first openings (material in region 111) is etched at a faster rate as compared to etching of fill material within the second openings (region 112 or iso area). Thus regions of higher density of structures have fill material that is etched faster. The second etch process is executed until the top surface of the first layer 121 is planar. The second etch process and the first etch process can be executed back-to-back in a same etch chamber. Switching from the first etch process to the second etch process can be transitioned, for example, by changing etch pressure and process gas after a signal is received that top surfaces of the micro-fabricated structures 107 have been uncovered.

Executing the second etch process can include increasing an etch chamber pressure as compared to a chamber pressure used with the first etch process. This can include maintaining an etch chamber pressure above 30 mTorr or more. Process gas chemistry for the second etch process can include increasing inhibitor gas or deposition gas as compared to the first etch process. Accordingly, executing the second etch process includes executing a reactive ion etch using etch parameters that cause a reverse lag effect etch. The reverse lag etch effect includes an etch process with a greater etch rate for comparatively smaller feature opening sizes as compared to an etch rate for comparatively larger feature opening sizes. Changes to etch parameters between the first etch process and the second etch process depend on type of overcoat or layer being etched and underlying material on the substrate. By way of a non-limiting example, a particular fill material for deposition can be titanium oxide. For executing the first etch process, etch parameters can include 30 mTorr chamber pressure, 68 sccm of Chlorine, 8 sccm of $CH_4$, and 200 sccm of helium, running for around 200-300 seconds. Then, for executing the second etch process, etch parameters can include 70 mTorr chamber pressure, 68 sccm of Chlorine, 6 sccm of $C_4F_6$, and 200 sccm of helium, running for around 15-45 seconds.

This second etch process essentially reverses the typical etch lag effect from reactive ion etching such that areas of high density of structures (smaller openings) etch faster, while open areas etch slower. In some embodiments, deposition happens in the open areas (wider openings) while material is etched from narrower openings. Thus, executing the second etch process can include etching within the first openings while simultaneously depositing etch chemistry within the second openings. The second etch process can include modifying process gas composition to have more deposition constituents, as compared to process gas used for the first etch process, such that fill material is deposited within the second openings or open spaces.

This second etch step can be executed until the top surface of the first layer 121 is planar in that top surface locations of the first layer differ in z-height compared to each other by less than three nanometers. An endpoint of this second etch step can be time-based, for example. FIG. 3 illustrates an example result of this reverse RIE lag process. Note that the micro-fabricated features 107 may protrude somewhat from first layer 121, but the first layer 121 nevertheless has a planar top surface relative to itself.

A second layer 122 of fill material is then deposited on the substrate 105. The second layer 122 can be a same or different material as the first layer. The second layer 122 results in a planar surface in that z-height differences are less than approximately three nanometers, and can be less than one nanometer. Although there may still be some lines protruding with regions of various densities, such features have a shorter height from the top surface of the first layer (compared to a height from the underlying layer 105) such that the modified iso-dense variations do not substantially affect the second layer used to complete planarization. An example illustration is shown in FIG. 4. Not that for this example, fill material of layer 122 is identical to layer 121.

Figure 5B:
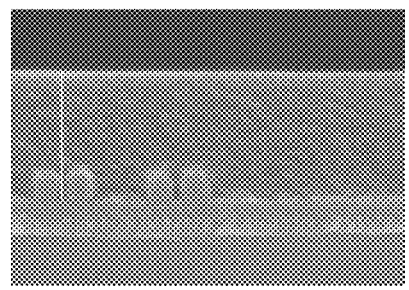
Figure 6A:
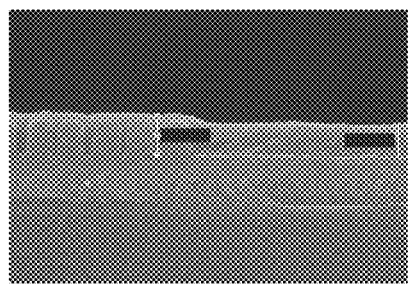
FIGS. 6A-6B include magnified views of example substrate segments demonstrating process flow according to embodiments disclosed herein.
Figure 6B:
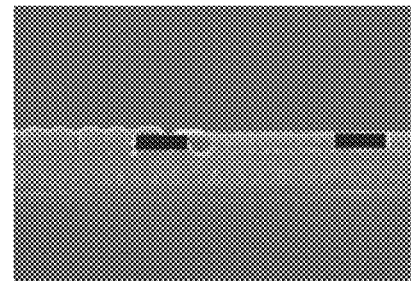
Figure 7A:
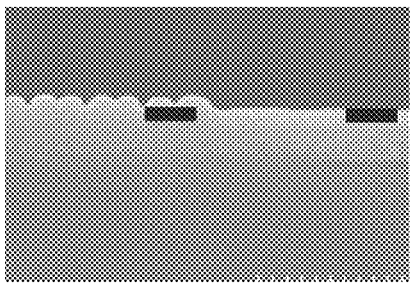
FIGS. 7A-7B include magnified views of example substrate segments demonstrating process flow according to embodiments disclosed herein.
Figure 7B:
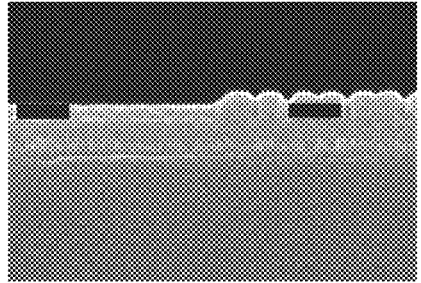
Figure 8A:
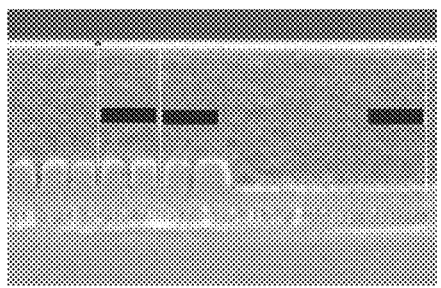
FIGS. 8A-8B include magnified views of example substrate segments demonstrating process flow according to embodiments disclosed herein.
Figure 8B:

FIGS. 5-8 show electron micrograph results from wafers using techniques disclosed herein. FIG. 5A shows a center portion of a substrate after depositing the first layer, while FIG. 5B shows an edge portion of the substrate. After this initial coating or layer is deposited, there is a z-height delta of about 6.6 nm. Next a first etch process or main etch is executed. FIG. 6A shows results at a center portion of the substrate with a z-height delta of 10 nm, while FIG. 6B shows results at an edge portion of the substrate having a z-height delta of 8 nm. The second etch process—reverse RIE lag etch—is executed. FIG. 7A shows results at a center portion of the substrate with a z-height delta of 1.3 nm, while FIG. 7B shows results at an edge portion of the substrate having a z-height delta of 0 nm. The substrate is then recoated after this planarization of the initial coat. FIG. 8A shows results at a center portion of the substrate with a z-height delta of 1.3 nm, while FIG. 7B shows results at an edge portion of the substrate having a z-height delta of 1.4 nm. Accordingly, a spin-on coating over topography can be planarized without CMP.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of planarizing a substrate, the method comprising:
   receiving a substrate having micro-fabricated structures formed thereon, the micro-fabricated structures being positioned on a working surface of the substrate, the micro-fabricated structures defining openings between each other, the openings having different widths including first openings and second openings, the first openings having a lesser width as compared to the second openings, the second openings having a greater width as compared to the first openings;
   depositing a first layer of fill material on the substrate, the first layer covering the micro-fabricated structures and filling the first openings and filling the second openings, the first layer resulting in a top surface that is non-planar in that top surface locations of the first layer differ in z-height compared to each other by 1-100 nanometers, the first layer having z-heights above the first openings that are greater as compared to z-heights above the second openings;
   executing a first etch process that etches the first layer until uncovering top surfaces of the micro-fabricated structures;
   executing a second etch process that etches the first layer such that the fill material within the first openings is etched at a faster rate as compared to etching of fill material within the second openings, the second etch process being executed until the top surface of the first layer is planar; and
   depositing a second layer of fill material on the substrate.

2. The method of claim 1, wherein executing the second etch process includes increasing an etch chamber pressure as compared to the first etch process.

3. The method of claim 2, wherein executing the second etch process includes maintaining an etch chamber pressure above 30 mTorr.

4. The method of claim 1, wherein executing the second etch process includes etching within the first openings while simultaneously depositing etch chemistry within the second openings.

5. The method of claim 1, wherein executing the second etch process includes modifying process gas composition to have more deposition constituents, as compared to process gas used for the first etch process, such that fill material is deposited within the second openings.

6. The method of claim 1, wherein executing the second etch process includes executing a reactive ion etch using etch parameters that cause a reverse lag effect etch.

7. The method of claim 6, wherein the reverse lag effect etch includes an etch process with a greater etch rate for comparatively smaller feature opening sizes as compared to an etch rate for comparatively larger feature opening sizes.

8. The method of claim 1, wherein the second etch process is executed until the top surface of the first layer has a z-height differential of less than three nanometers.

9. The method of claim 1, wherein the first openings include trenches having defined openings smaller than openings that correspond to the second openings.

10. The method of claim 1, wherein depositing the first layer of fill material on the substrate includes depositing the first layer by spin-on deposition; and
    wherein depositing the second layer of fill material on the substrate includes depositing the second layer of fill material by spin-on deposition.

11. A method of planarizing a substrate, the method comprising:
    receiving a substrate having micro-fabricated structures formed thereon, the micro-fabricated structures being positioned on a working surface of the substrate, at least a portion of the micro-fabricated structures defining open spaces between each other, wherein the substrate has two or more regions of micro-fabricated structures, the two or more regions having a different density of micro-fabricated structures per unit area as compared to each other;
    depositing a first layer of fill material on the substrate, the first layer filling spaces between the micro-fabricated structures and covering at least a portion of the micro-fabricated structures, the first layer resulting in a top surface that is non-planar in that top surface locations of the first layer differ in z-height compared to each other by 1-100 nanometers, the first layer having greater z-heights in regions of greater density of micro-fabricated structures as compared to regions of lesser density of micro-fabricated structures;
    executing a first etch process that etches the first layer until uncovering top surfaces of the micro-fabricated structures;
    executing a second etch process that etches the first layer such that the fill material in regions having greater density of micro-fabricated structures is etched at a faster rate as compared to fill material in regions having lesser density of micro-fabricated structures, the second etch process being continued until the top surface of the first layer is planar; and depositing a second layer of fill material on the substrate.

12. The method of claim 11, wherein executing the second etch process includes increasing an etch chamber pressure as compared to the first etch process.

13. The method of claim 12, wherein executing the second etch process includes maintaining an etch chamber pressure above 30 mTorr.

14. The method of claim 11, wherein executing the second etch process includes etching within the first openings while simultaneously depositing etch chemistry within the second openings.

15. The method of claim 11, wherein executing the second etch process includes modifying process gas composition to have more deposition constituents, as compared to process gas used for the first etch process, such that material is deposited within the second openings.

16. The method of claim 11, wherein executing the second etch process includes executing a reactive ion etch with a reverse lag effect etch.

17. The method of claim 16, wherein the reverse lag effect etch includes an etch process with a greater etch rate for comparatively smaller feature opening sizes as compared to an etch rate for comparatively larger feature opening sizes.

18. The method of claim 11, wherein the second etch process is executed until the top surface of the first layer has a z-height less than three nanometers.

19. The method of claim 11, wherein the first openings include trenches having defined openings smaller than openings that correspond to the second openings.

20. The method of claim 11, wherein depositing the first layer of fill material on the substrate includes depositing the first layer by spin-on deposition; and wherein depositing the second layer of fill material on the substrate includes depositing the second layer by spin-on deposition.

* * * * *